United States Patent [19]

Li et al.

[11] Patent Number: 5,516,708

[45] Date of Patent: May 14, 1996

[54] METHOD OF MAKING SINGLE POLYSILICON SELF-ALIGNED BIPOLAR TRANSISTOR HAVING REDUCED EMITTER-BASE JUNCTION

[75] Inventors: Xiao-Ming Li, Ottawa; T. Victor Herak, Kanata, both of Canada

[73] Assignee: Northern Telecom Limited, Montreal, Canada

[21] Appl. No.: 342,041

[22] Filed: Nov. 17, 1994

[51] Int. Cl.$^6$ .................................................. H01L 21/265
[52] U.S. Cl. ........................... 437/31; 437/101; 437/193; 437/909; 437/940; 148/DIG. 10; 257/565; 257/588; 257/592
[58] Field of Search .............................. 437/31, 193, 101, 437/909, 940; 148/DIG. 10, DIG. 11; 257/565, 588, 592

[56] References Cited

U.S. PATENT DOCUMENTS

| | | | |
|---|---|---|---|
| 4,784,966 | 11/1988 | Chen | 437/31 |
| 4,789,885 | 12/1988 | Brighton et al. | 357/34 |

OTHER PUBLICATIONS

"50-GHz Self-Aligned Silicon Bipolar Transistors with Ion-Implanted Base Profiles" James Warnock et al IEEE Electron Device Letters, vol., 11, No. 10, Oct. 1990 pp. 475–477.

"A High-Speed Bipolar Technology Featuring Self-Aligned Single-Poly Base and Submicrometer Emitter Contacts" W. M. Huang, et al IEEE Electron Device Letters, vol., 11, No. 9, Sep. 1990 pp. 412–414.

"Electron Recombination at the Silicided Base Contact of an Advanced Self-Aligned Poly-Silicon Emitter" J. L. de Jong, et al IEEE 1988 Bipolar Circuits & Technology Meeting Paper 9.5, pp. 202–205, 1988.

"An Advanced Bipolar Transistor with Self-Aligned Ion-Implanted Base and W/Poly Emitter" Tze-Chiang Chen, et al IEEE Transactions on Electron Devices, vol., 35, No. 8, Aug. 1988, pp. 1322–1327.

"Silicon Processing for the VLSI Era vol. 2, Process Interpretation" (1990) S. Wolf pp. 516–520.

*Primary Examiner*—George Fourson
*Assistant Examiner*—Long Pham
*Attorney, Agent, or Firm*—Angela C. de Wilton

[57] ABSTRACT

A self-aligned single polysilicon bipolar transistor structure and a method of formation thereof are provided. The transistor has an emitter structure characterised by T shape defined by inwardly extending sidewall spacers formed by oxidation of amorphous or polycrystalline silicon, rather than the conventional oxide deposition and anisotropic etch back. Advantageously the method compatible with bipolar CMOS processing and provides a single polysilicon self-aligned bipolar transistor with a reduced number of processing steps. Further the formation of inwardly extending sidewalls defining the emitter width reduces the emitter base junction width significantly from the minimum dimension which is defined by photolithography, while a large area emitter contact is also provided.

8 Claims, 5 Drawing Sheets

METHOD OF MAKING SINGLE POLYSILICON SELF-ALIGNED BIPOLAR TRANSISTOR HAVING REDUCED EMITTER-BASE JUNCTION

FIELD OF THE INVENTION

This invention relates to a self-aligned bipolar transistor and method of fabrication thereof.

BACKGROUND OF THE INVENTION

Processes are known for fabrication of bipolar transistors having a self-aligned structure, using a first polysilicon layer for the extrinsic base contact and a second polysilicon layer for the emitter contact, for example as described in an article entitled "High speed polysilicon emitter base bipolar transistor" by Hee K. Park et al., IEEE Electron Device Letters, EDL-7 no 12 December 1986. Self-alignment of the base and the emitter allows for minimization of both the extrinsic base resistance and the collector-base junction capacitance.

Another example of a double polysilicon structure is described in an article by Warnock et al. entitled "50 GHz Self-Aligned Silicon Bipolar Transistors with Ion Implanted Base Profiles", IEEE Electron Device Letters, Vol. 11, no. 10 (Oct. 1990).

The conventional double-poly process requires first and second polysilicon layer and the resulting structure has highly non-planar topography. In particular, the topography of the polysilicon layer forming the emitter may have a sharp discontinuity in the emitter region, requiring a very thick polysilicon layer to fill the emitter gap without voids. The latter complicates subsequent processing steps, including metallization and dielectric planarization, and creates problems in contact imaging, and contact etch. The depth differential of the contact to the emitter and the contact to the sinker is very large and they are in close proximity to one another. The resulting high aspect ratio contact holes are difficult to form while preserving the underlying salicide.

There is risk from potential damage of the emitter-base junction during etching of the emitter opening in the first polysilicon layer because there is no etch stop, i.e. there is little or no etch selectivity to the underlying silicon. Damage to the emitter-base junction due to over-etching can have severe implications for the noise of the transistor for analog applications. Variable recessing of the base during silicon over etch, and consequent sidewall spacer width variability, can lead to variability in emitter width. The ensuing variations in emitter-base capacitance along the sidewall spacer edge and emitter polysilicon contact area cannot be avoided without exacerbating the topography related problems.

Furthermore, the doping in the link region of the base cannot be controlled independently of the base implant dose, leading to higher than desirable base resistance and/or emitter-base edge leakage problems.

Thus, the latter process for a double-poly self-aligned NPN bipolar transistor is complex and suffers from a number of process related problems, which lead to reliability issues in the resulting device structure.

As described in an article entitled "A high speed bipolar technology featuring self-aligned single poly base and submicrometer emitter contacts" by W. M. Huang et al. IEEE Electron Device Letters vol. 11, no. 9 September 1990, problems with etching double polysilicon structures may be avoided by fabricating the emitter contact with the first layer of polysilicon. The latter process is known as the "STRIPE" (self-aligned trench isolated polysilicon electrodes) process. The polysilicon layer is etched to define trenches for isolating the emitter region from the base regions. A low energy boron implant into the trench region defines a link region. Then the trench is filled with oxide and then the emitter region is n+ doped by an arsenic implant. This process reduces the possibility of etch damage of the active emitter area and avoids the highly non-planar topography of the conventional double poly process. However, other process related problems remain in the PE and subsequent processing steps, including etching of the polysilicon layer to form narrow trenches (0.2 to 0.4 µm) for isolation between the emitter and base regions.

Another approach to forming a single polysilicon self-aligned bipolar transistor, known as the ASPECT process, comprises forming a p type base region in the device well similarly as described above, and then forming an emitter structure by depositing a layer of polysilicon overall, patterning and etching the polysilicon to leave an emitter structure in the form of a mesa, and isolating the emitter mesa with oxide sidewall spacers, before forming contacts to the base contact region surrounding the emitter mesa. However, the latter process does not avoid the risk of damage to the underlying silicon layer in the base contact region during overetching of the polysilicon layer region.

Further examples of single polysilicon bipolar transistors are discussed in section 7.9.2 of Wolf "Silicon Processing for the VLSI Era", vol. 2-Process Integration; (1990), pages 516 to 520; an article by Chen et al, entitled "Advanced bipolar transistor with self-aligned ion-implanted base and w/poly emitter", IEEE Transactions on Electron Devices Vol. 35, no. 8, (Aug. 1988); and IEEE 1988 Bipolar Circuits and Technology meeting, paper no. 9.5, "Electron Recombination at the Silicided Base Contact of an Advanced Self-aligned Polysilicon Emitter" by de Jong et al.

SUMMARY OF THE INVENTION

The present invention seeks to provide a bipolar transistor and a method of fabrication of a bipolar transistor which reduces or avoids the above mentioned problems.

Thus according to one aspect of the present invention there is provided a method of fabricating a bipolar transistor comprising: providing an integrated circuit substrate comprising a semiconductor well region of a first conductivity type; forming thereon a thin dielectric layer; depositing thereon a bilayer comprising a first layer of silicon, and a second layer of an oxidation resistant material; patterning the bilayer to form an emitter mask and expose adjacent surface regions of substrate; selectively doping the adjacent surface regions to define heavily doped extrinsic base regions of a second conductivity type; exposing the structure to an oxidizing atmosphere to grow an oxide layer overall and partially oxidize sidewalls of the silicon layer under the oxidation resistant masking layer to form inwardly extending dielectric sidewall spacers; removing the oxidation resistant masking layer; removing any remaining unoxidized part of the silicon layer leaving the thin dielectric layer thereunder; selectively implanting the surface region between the sidewall spacers to define an intrinsic base region of the second conductivity type; selectively removing the thin oxide from surface of the intrinsic base region, leaving the dielectric sidewall spacers and the oxide on extrinsic base regions; providing a layer of conductive material of the first conductivity type overall, and patterning and selectively etching said conductive layer to define an emitter structure extending laterally over the dielectric sidewall spacers; selectively removing oxide from the extrinsic base region adjacent the emitter structure to form base contact openings to extrinsic base region; forming contacts to the emitter and base regions.

Thus a method of forming a self-aligned single polysilicon bipolar transistor is provided which has fewer method steps than typical known methods. Dielectric sidewall spacers are formed by oxidation of sidewalls of the silicon masking structure, rather than by conventional oxide deposition and anisotropic etching. The sidewall spacers extend inwardly of the lithographically defined emitter mask dimension, and thus define a relatively narrow emitter opening for formation therein of the base region and emitter structure. The process requires relatively few process steps compared with known self-aligned bipolar transistor structures. Thus, a self-aligned bipolar transistor with an implanted base, and reduced emitter-base junction width may be obtained, for example, 0.1–0.2 µm less than 0.5 µm lithography. Nevertheless, the method provides a self-aligned bipolar transistor structure having a large area emitter contact area.

Conveniently, the bilayer emitter mask is provided by a layer of amorphous or polysilicon, which is readily and controllably oxidized to form the sidewalls, with an overlying layer of oxidation resistant material comprising for example, silicon nitride. Oxidation may be by any suitable known process, including e.g. wet oxidation or high pressure oxidation.

The emitter structure may be provided by depositing a layer of polysilicon, subsequently doped by implantation or doped in situ during deposition, or by deposition of other suitable known emitter materials, e.g silicon carbide.

According to another aspect of the invention there is provided a bipolar transistor comprising: a semiconductor substrate comprising a region of a first conductivity type defining a collector; an active base region of a second conductivity type formed in the surface of the substrate, and heavily doped extrinsic base regions of a second conductivity type formed in an adjacent surface region of the substrate; an emitter structure of a first conductivity type forming an emitter base junction self-aligned with the active base region; the emitter structure having a T shaped form, with dielectric sidewall spacers isolating the emitter structure from adjacent extrinsic base contact regions, the T shape of the emitter structure being defined by a portion of the dielectric sidewall spacers extending inwardly under the horizontal part of the T shape at the base of the emitter structure, an inner portion of the sidewall spacers around the emitter base junction being thicker than the other portion of the sidewall under the horizontal part of the T shape.

Thus a self-aligned bipolar transistor is provided with a T shaped emitter structure and an implanted base, which provides a narrow emitter base junction and a relatively large area emitter contact region.

This process sequence may also be adapted to form MOSFET transistors, if the thin oxide layer remains as a gate oxide under the layer of conductive material, and patterning to define a MOS gate electrode.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
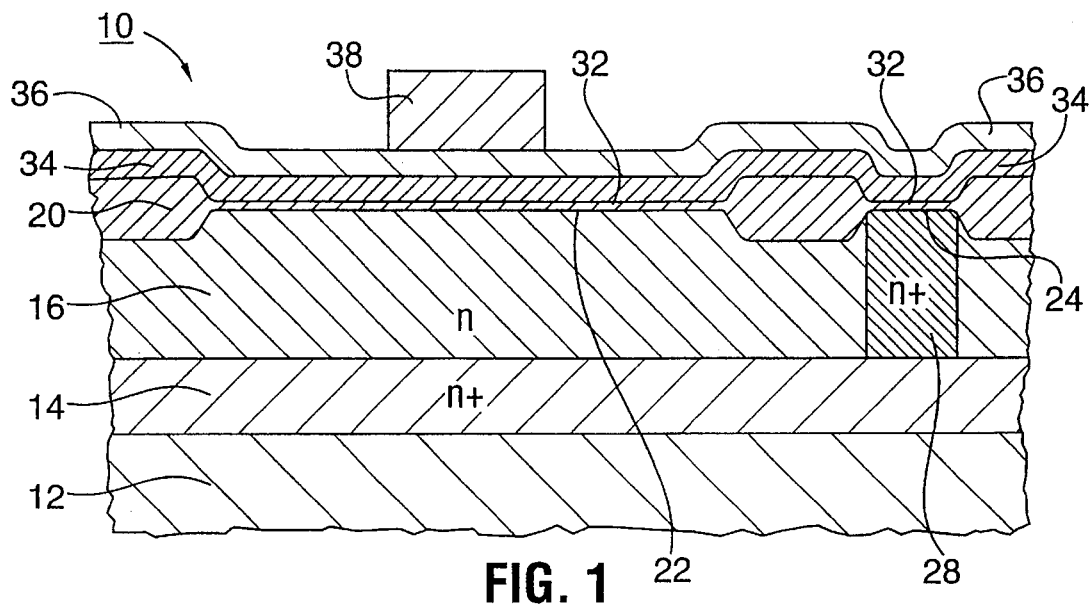
FIGS. 1 to 8 show cross sectional views through part of a p integrated circuit comprising a bipolar transistor according to a first embodiment of the present invention, at successive stages in its fabrication.

In a method of forming a bipolar transistor 10 according to a first embodiment of the present invention, a conventional semiconductor substrate 12 for a bipolar/CMOS integrated circuit is provided, e.g. as shown in FIG. 1, the substrate comprises p type semiconductor wafer having a heavily doped n-type buried layer 14 and an overlying lightly n-doped well region 16. A dielectric layer of field isolation 20 is provided by a known method, e.g. by conventional local oxidation of silicon, PBL (poly buffered LOCOS) or shallow trench isolation. Opening 22 is provided in the the field isolation 20 and defines a device well, and an adjacent opening 24 provides for contact to the buried layer 14, in the form of a heavily doped region (sinker) 28. In steps for forming the bipolar transistor 10 according to the embodiment, a thin layer of oxide 32, e.g. 150 Å pad oxide, is grown on the surface of the substrate in the device well regions 22 and 24. Then a bilayer is deposited overall, comprising a first layer of a material 34 which can be oxidised to form a dielectric sidewall spacer as will be described below. For example 500 Å amorphous silicon is deposited overall to form layer 34. The second layer comprises a layer of oxidation resistant material 36, e.g. a 400 Å layer of silicon nitride.

Figure 2:
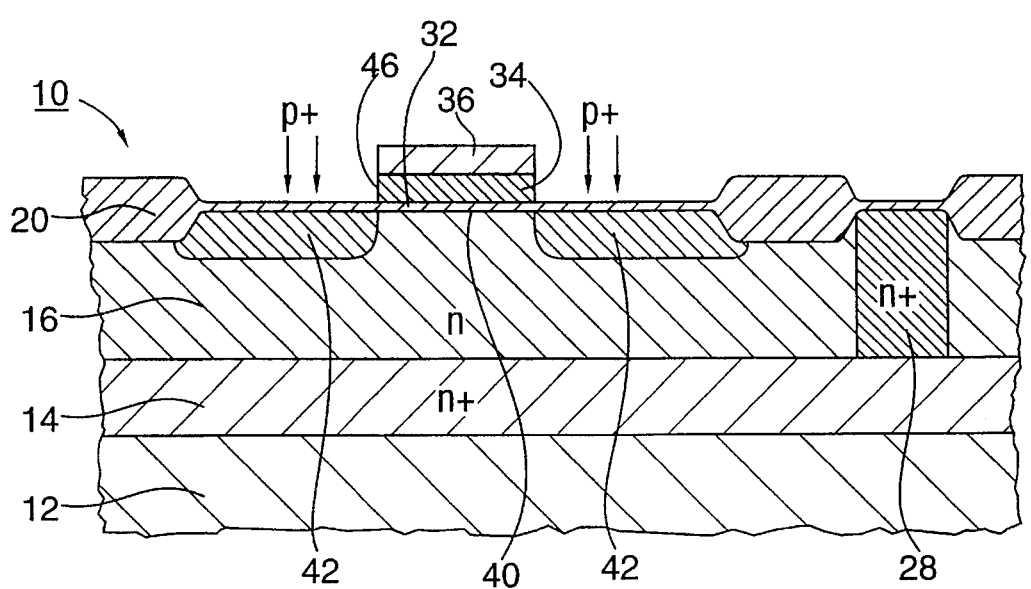

The bilayer is then selectively masked with photoresist 38, and using an emitter PE, as shown in FIG. 1. That is, the silicon nitride and amorphous silicon layers are patterned and etched, stopping on the pad oxide, to leave the bilayer masking an emitter region 40. The emitter PE mask is then stripped (FIG. 2). After selectively masking surrounding regions to expose parts of the surface 22 defining extrinsic base regions 42 adjacent the emitter masking stack, these reigions are selectively implanted to form heavily P+ doped extrinsic base regions, for example using 5 keV $B^{11}$ implant at a dose of $5\times10^{15}$ cm$^{-2}$.

Figure 3:
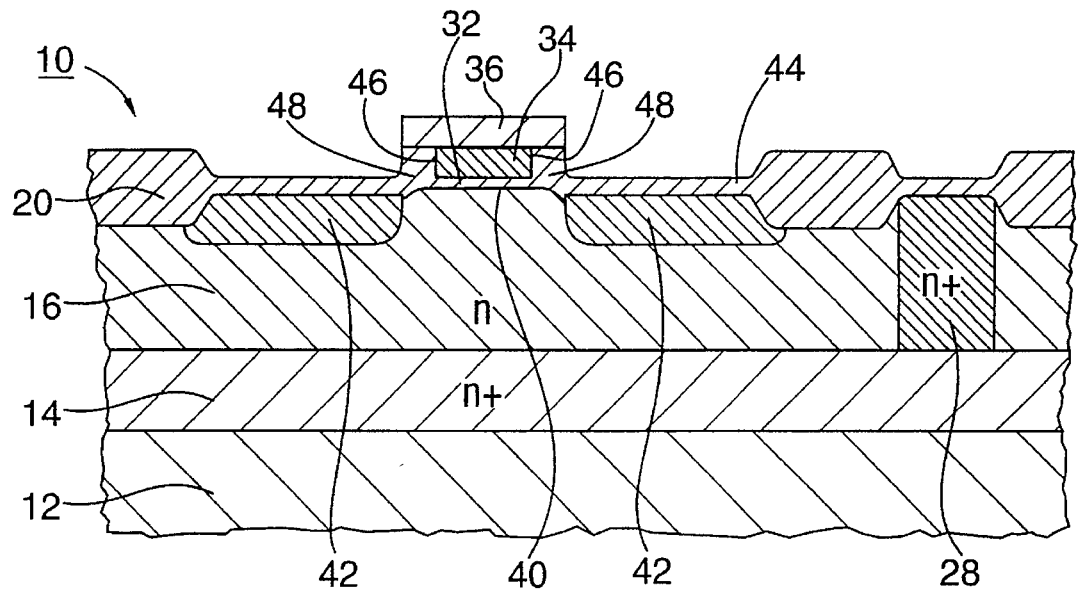

After stripping the photoresist, the structure is exposed to an oxidising atmosphere to form a relatively thick layer 44 of oxide overall, e.g. about 1000 Å formed by wet oxidation (FIG. 3). In the oxidation step, the sidewalls 46 of the amorphous silicon layer 34 are oxidized so that an inward sidewall spacer 48 is formed by converting the outer edges 46 of the layer of amorphous silicon 34 to oxide, For example the outer 500 Å of the amorphous silicon 34 may be oxidized to provide an oxide sidewall spacer which is about 1000 Å wide on each side.

Figure 4:
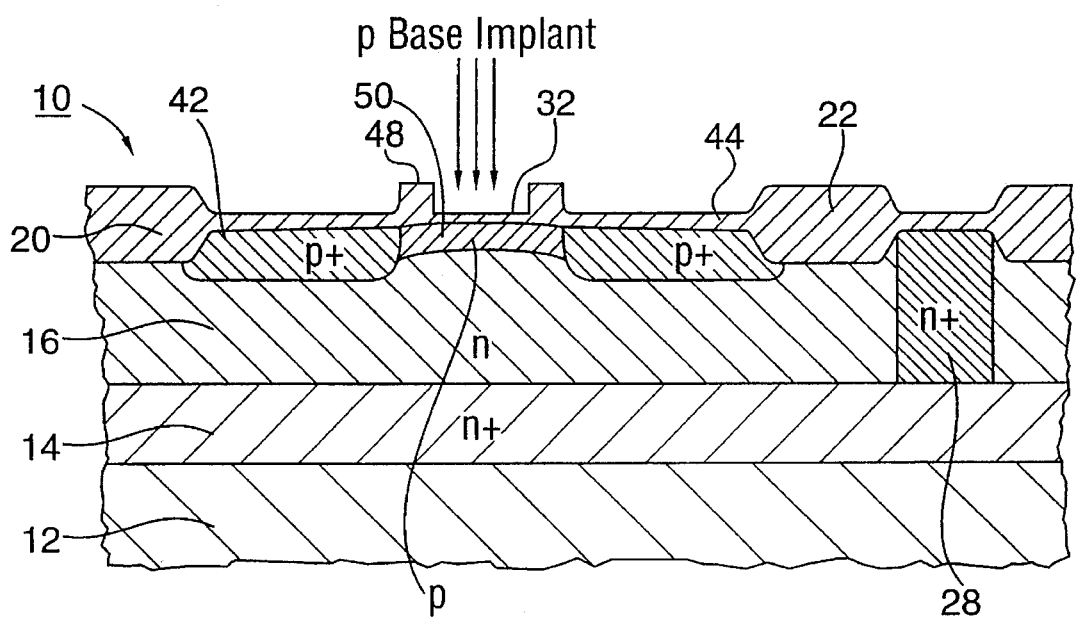
Figure 5:
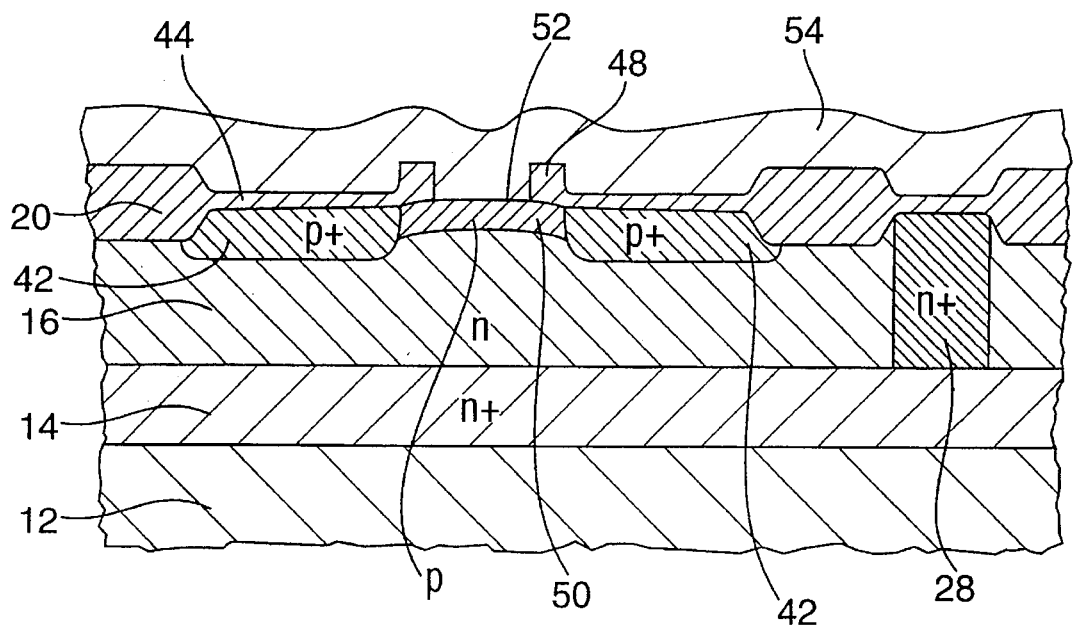
Figure 6:
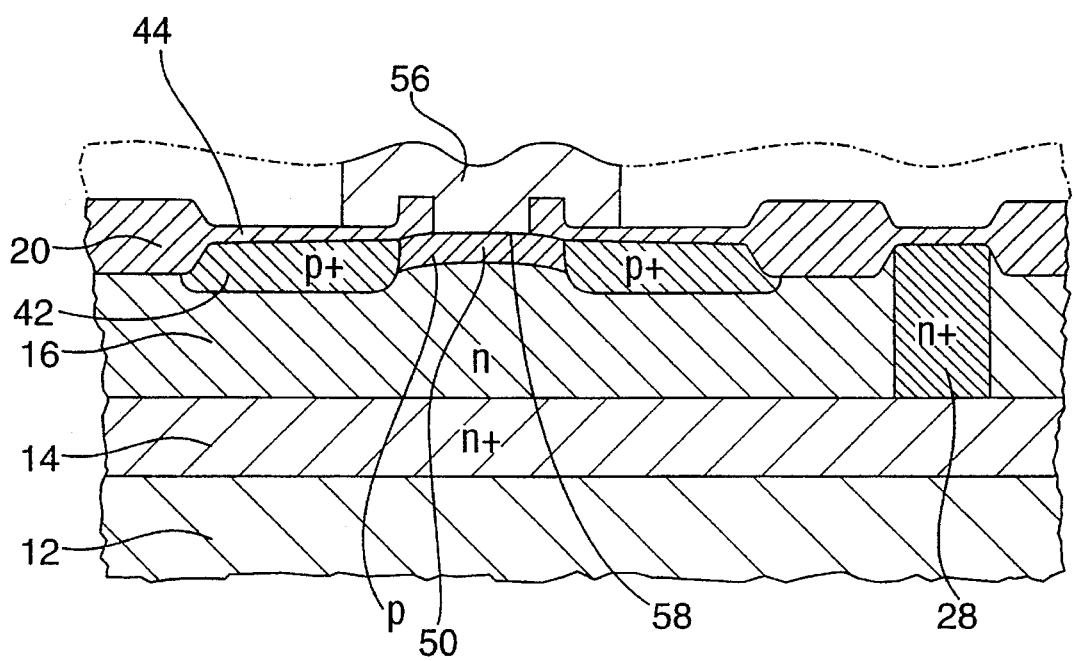
Figure 7:
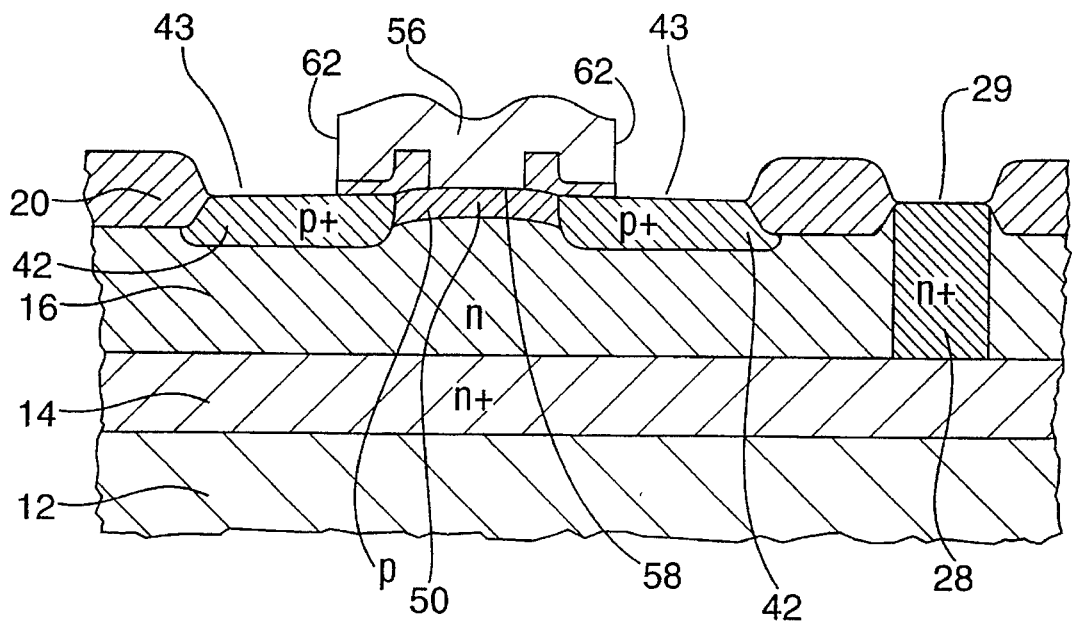
Figure 8:
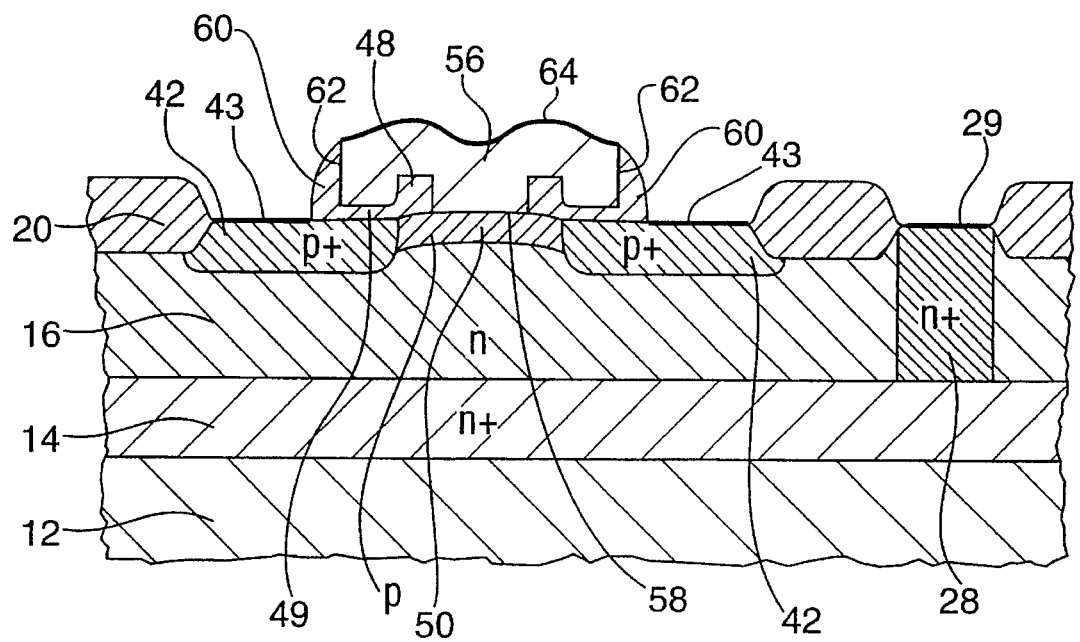
Figure 9:
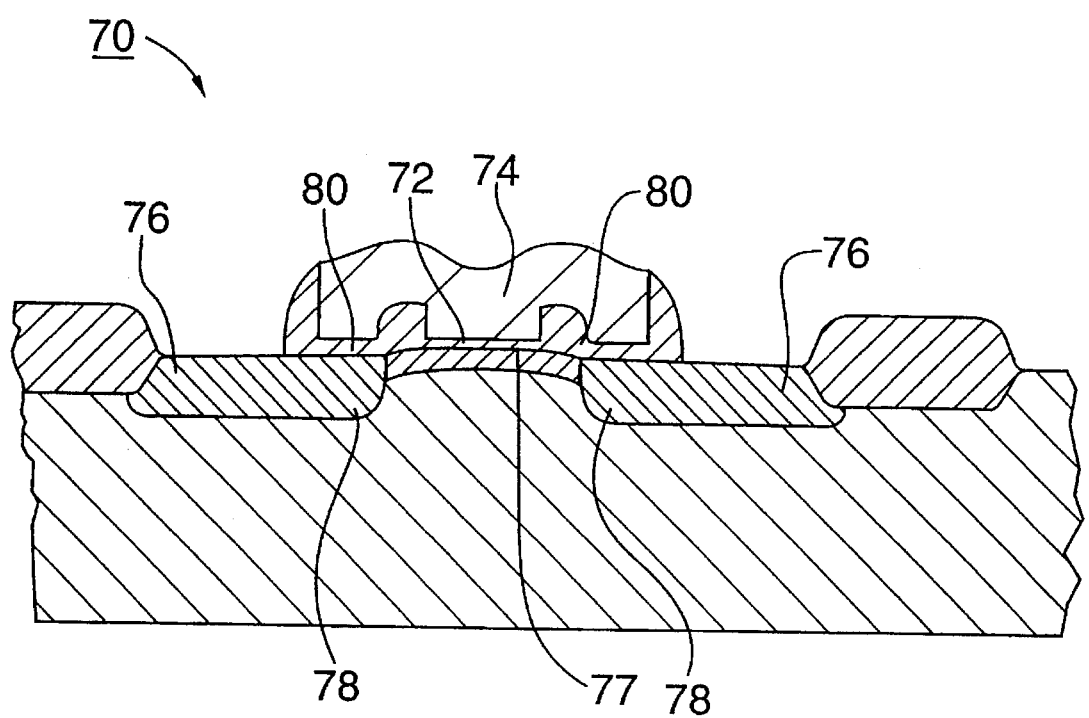
FIG. 9 shows a transistor structure according to a second embodiment of the present invention.

The nitride layer 36 is then stripped and the polysilicon layer 34 is selectively removed from the underlying pad oxide layer 32, leaving the sidewall spacers 48 (FIG. 4). A blanket P base implant, e.g. 10 keV $B^{11}$ at a dose of $3\times10^{13}$ cm$^{-2}$ is then performed, through the remaining pad oxide 32, to define the active base region 50 of the transistor. Beneficially the thin oxide layer 32 is left in place to protect the surface of the base region from contamination and improves implant uniformity. After implantation, the remaining pad oxide layer 32 is removed from surface of the base region 50, leaving the oxide sidewall spacers 48 as shown in FIG. 5. Since the sidewall spacers are grown inwardly from the originally defined lithographic dimension of the emitter masking bilayer, sidewalls 48 define an emitter opening 52 narrower than the original width of the emitter masking bilayer.

Thermal processing after the base implant step results in some lateral diffusion of dopant from the extrinsic base contact regions 42 into the link region of the base under the sidewall spacers thereby linking the extrinsic base region with the base region 50.

A conductive layer 54, comprising doped polysilicon is then formed overall, to fill the emitter opening, and is patterned and etched to define emitter structure 56 forming an emitter-base junction 58 in the region defined by the sidewall spacers 48. The emitter polysilicon extends over the sidewall spacers 48 to form a T shaped emitter structure 56.

Contact holes 43 and 29 are then opened over the extrinsic base regions 42 and sinker region 28 respectively, e.g. by anisotropic etching of the oxide layer 44, to allow for formation of base and collector contacts in a conventional manner. Beneficially base contact regions 43 and collector contact region 29 are salicided to reduce contact resistance. A dielectric sidewall spacer 60 is then formed (i.e. in a conventional manner, by oxide deposition and anisotropic etching) on the upper exposed part 62 of the sidewalls of the emitter structure 56 to allow for salicidation of the top surface 64 of the emitter structure to reduce contact resistance. Subsequent metallization and interconnects are then provided in a conventional manner.

Thus a straightforward method is provided with a reduced number of process seeps for forming a self-aligned, single polysilicon bipolar transistor. The active base region is self-aligned to the P+ base region by the sidewall spacer formation process. The sidewall spacer is formed by local oxidation of amorphous silicon, rather than the traditional oxide deposition and anisotropic etch back. The sidewall spacer is thus formed inwardly from the initial feature, i.e. the PE defined dimension of the bilayer, amorphous silicon/silicon nitride stack.

Since the sidewall spacer extends inwardly from the PE defined dimension, the emitter is T shaped, and the emitter-base junction region may be narrower, than the PE defined emitter opening, i.e. by the width of the sidewall spacers. For example if the bilayer stack is defined by an 0.5 µm lithography, after forming inward sidewall spacers, the emitter-base junction width may be 0.2 to 0.3 µm narrower than an PE defined emitter opening. Beneficially since the lateral parts of the T shaped emitter structure extend laterally over the thicker inner part of sidewall spacers 48 and the thinner surrounding part 49 of the sidewall spacers underlying sides of the T shape emitter. Thus the resulting self-aligned bipolar transistor is characterized by a narrow emitter base junction 58 and a relatively large area contact region 64 provided on top of the emitter structure 56. This significantly reduces constraints on emitter contact placement and reduces contact misalignment problems typical with small dimension emitter contacts.

A variation of the above described method may be adapted for formation of a polysilicon gate structure of a MOS transistor 70 by providing a gate oxide 72 under the polysilcion structure 74 which then forms the MOS gate electrode. Surface region 77 under the gate may be selectively implanted with a threshold adjust implant before forming the game structure. Heavily doped regions 76 define the source and drain regions of the MOS transistor, and a quasi LDD (lightly doped drain) region 78 extends under the sidewalls 80 after lateral thermal processing to cause diffusion of impurities from the source/drain region.

What is claimed is:

1. A method of fabricating a bipolar transistor comprising:

providing an integrated circuit substrate comprising a semiconductor well region of a first conductivity type;

forming thereon a thin dielectric layer;

depositing thereon a bilayer comprising a first layer of silicon, and a second layer of an oxidation resistant material;

patterning the bilayer to form an emitter mask and expose adjacent surface regions of substrate;

selectively doping the adjacent surface regions to form heavily doped extrinsic base regions of a second conductivity type;

exposing the structure to an oxidizing atmosphere to grow an oxide layer overall and partially oxidize sidewalls of the silicon layer under the oxidation resistant layer to form inwardly extending dielectric sidewall spacers;

removing the oxidation resistant layer;

removing any remaining unoxidized part of the silicon layer leaving the thin dielectric layer thereunder;

selectively implanting the surface region between the sidewall spacers to form an intrinsic base region of the second conductivity type;

selectively removing the thin dielectric layer from surface of the intrinsic base region, leaving the dielectric sidewall spacers and the oxide layer on extrinsic base regions;

providing a layer of conductive material of the first conductivity type overall, and patterning and selectively etching said conductive layer to define an emitter structure extending laterally over the dielectric sidewall spacers;

selectively removing oxide layer from the extrinsic base region adjacent the emitter structure to form base contact openings to extrinsic base region;

forming contacts to the emitter and base regions.

2. A method according to claim 1 wherein the bilayer comprises a first layer of amorphous silicon and a second layer of silicon nitride.

3. A method according to claim 1 wherein the silicon layer comprises amorphous silicon.

4. A method according to claim 1 wherein the silicon layer is polycrystalline silcon.

5. A method according to claim 1 wherein the step of oxidation comprises wet oxidation.

6. A method according to claim 1 wherein the step of oxidation comprises high pressure oxidation.

7. A method according to claim 1 providing a layer of conductive material of the first conductivity type overall comprsises deposition of a layer of polysilicon and ion implantion and annealing to form a conductive layer.

8. A method according to claim 1 providing a layer of conductive material of the first conductivity type overall comprsises deposition of a layer of in-situ doped polysilicon by chemical vapour deposition.

* * * * *